United States Patent
Lai et al.

(10) Patent No.: US 9,948,325 B2
(45) Date of Patent: Apr. 17, 2018

(54) DATA PROCESSING CIRCUIT AND METHOD FOR DE-INTERLEAVING PROCESS IN DVB-T2 SYSTEM

(71) Applicant: MStar Semiconductor, Inc., Hsinchu Hsien (TW)

(72) Inventors: Ko-Yin Lai, Zhubei (TW); Yu-Shen Chou, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 237 days.

(21) Appl. No.: 14/951,617

(22) Filed: Nov. 25, 2015

(65) Prior Publication Data

US 2016/0154741 A1   Jun. 2, 2016

(30) Foreign Application Priority Data

Nov. 28, 2014   (TW) .............................. 103141351 A

(51) Int. Cl.
*G09G 5/36* (2006.01)
*H03M 13/00* (2006.01)
(Continued)

(52) U.S. Cl.
CPC ... *H03M 13/6552* (2013.01); *H03M 13/2764* (2013.01); *H04L 1/0071* (2013.01); *H04L 27/265* (2013.01)

(58) Field of Classification Search
CPC .......... H03M 13/6552; H03M 13/2764; H04L 1/0071; H04L 27/265
(Continued)

(56) References Cited

U.S. PATENT DOCUMENTS 8,396,104 B2   3/2013   Taylor et al.
2007/0139428 A1*   6/2007   Berkeman ........... H03M 13/271
                                           345/565
(Continued)

FOREIGN PATENT DOCUMENTS

TW   200623652 A   7/2006

OTHER PUBLICATIONS

"DVB-T2: The second generation of terrestrial digital video broadcasting system." IEEE Transactions on Broadcasting 60.2 (2014): pp. 258-271.*

(Continued)

*Primary Examiner* — Xiao Wu
*Assistant Examiner* — Sarah Lhymn
(74) *Attorney, Agent, or Firm* — Edell, Shapiro & Finnan, LLC

(57) ABSTRACT

A data processing circuit for performing a de-interleaving process in a DVB-T2 system is provided. The data processing circuit includes: a buffer, buffering a plurality of data symbols; a memory, coupled to the buffer; an address generator, generating a plurality of addresses according to an operation logic and a permutation rule, and selecting and outputting a target address from the addresses; and a memory controller, coupled to the memory, the buffer and the address generator, writing the target data into the memory according to the target address, or/and reading the target data from the memory according to the target address, until the data symbols are de-interleaved when the data symbols are read from the memory.

19 Claims, 13 Drawing Sheets

(51) Int. Cl.
*H03M 13/27* (2006.01)
*H04L 27/26* (2006.01)
*H04L 1/00* (2006.01)

(58) Field of Classification Search
USPC ....... 345/530, 559, 560, 561, 564, 566, 567, 345/572, 574
See application file for complete search history.

(56) References Cited

U.S. PATENT DOCUMENTS

2010/0296593 A1* 11/2010 Atungsiri .............. H04L 1/0071
375/260
2012/0250777 A1* 10/2012 Peron ................ H03M 13/2742
375/260

OTHER PUBLICATIONS

Taiwan Office Action, Jan. 12, 2016, 5 pages.

* cited by examiner

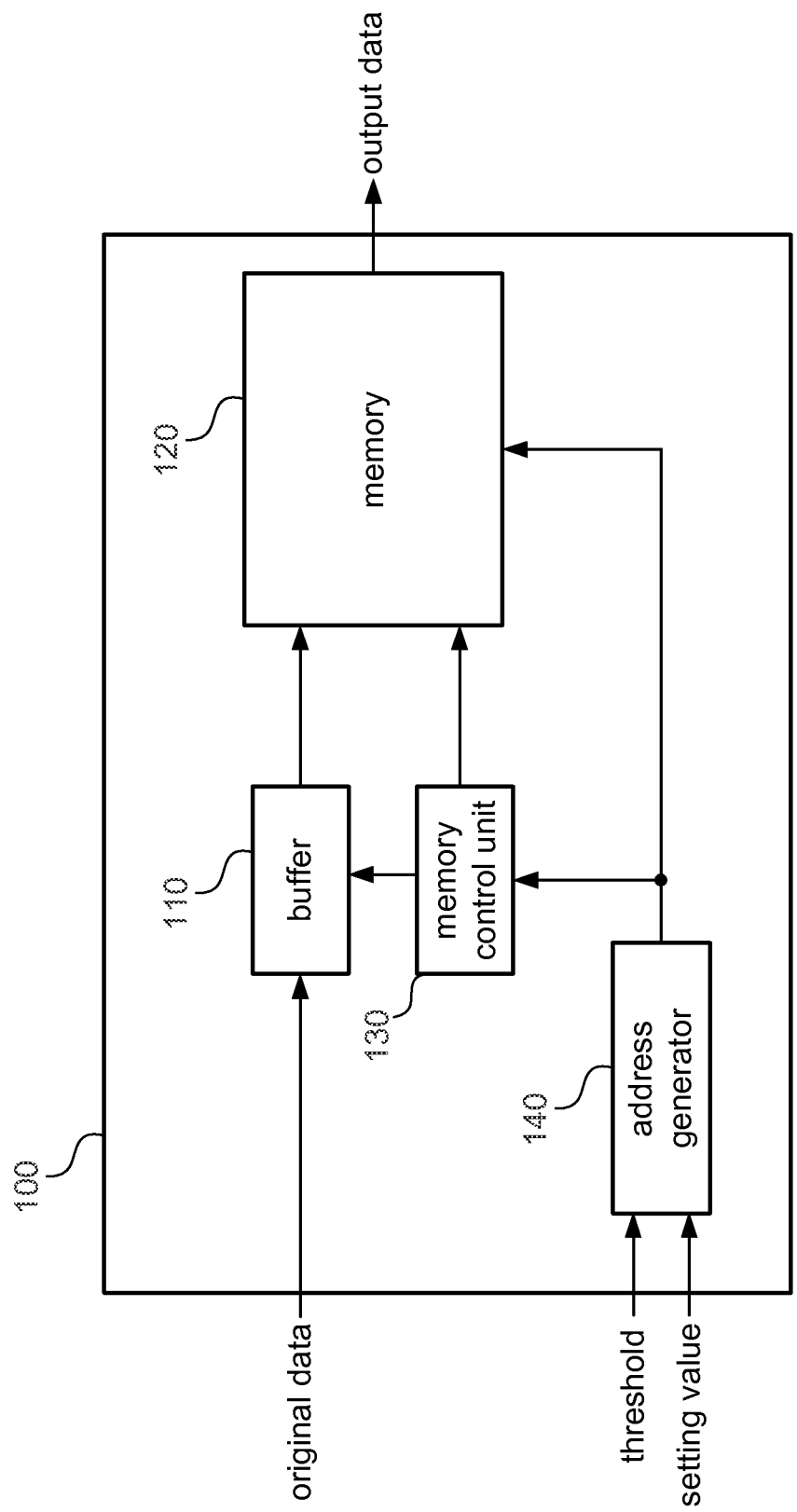

| i | 0 | 1 | 2 | 3 | 4 | 5 | 6 | 7 | 8 | 9 |
|---|---|---|---|---|---|---|---|---|---|---|
| $H_a$ | 0 | | 16 | | 128 | | 2 | | 4 | |
| $H_b$ | 1024 | | 1025 | | 1056 | | 1280 | | 1088 | |
| p | 0 | 1 | 2 | 3 | 4 | 5 | 6 | | 7 | 8 |
| $H(p)$ | 0 | 1024 | 16 | 1025 | 128 | 1056 | 2 | | 4 | 1088 |

FIG. 10

| I | 0 | 1 | 2 | 3 | 4 | 5 | 6 | 7 | 8 | 9 |
|---|---|---|---|---|---|---|---|---|---|---|
| Ha | | | | 1025 | | 1056 | | 1280 | | 1088 |
| Hb | | | | 128 | | 2 | | 4 | | 513 |
| P | 0 | 1 | 2 | 3 | 4 | 5 | 6 | 7 | | 8 |
| $H(p)$ | 0 | 1024 | 16 | 1025 | 128 | 1056 | 2 | 4 | | 1088 |

FIG. 11

DATA PROCESSING CIRCUIT AND METHOD FOR DE-INTERLEAVING PROCESS IN DVB-T2 SYSTEM

This application claims the benefit of Taiwan application Serial No. 103141351, filed Nov. 28, 2014, the subject matter of which is incorporated herein by reference.

BACKGROUND OF THE INVENTION

Field of the Invention

The invention relates in general to a de-interleaving circuit and method, and more particularly to a data processing circuit and method for a de-interleaving process in a Digital Video Broadcasting-Second Generation Terrestrial (DVB-T2) system.

Description of the Related Art

Orthogonal Frequency Division Multiplexing (OFDM) signals generated and transmitted according to specifications of Digital Video Broadcasting-Second Generation Terrestrial (DVB-T2), "Digital Video Broadcasting (DVB); Frame Structure Channel Coding and Modulation for a Second Generation Digital Terrestrial Television Broadcasting System (DVB-T2)" (to be referred to as the specification document) undergo an interleaving process at a transmitting end, and correspondingly need to undergo a de-interleaving process at a receiving end. The de-interleaving process at the receiving end at least includes a frequency de-interleaving process and a cell de-interleaving process. In the frequency de-interleaving process, all data cells of an OFDM symbol are de-interleaved. In the cell de-interleaving process, all data cells of an OFDM forward error correction (FEC) block are de-interleaved. Receiving circuits or systems of all DVB-T2 systems need to follow the specifications to complete the de-interleaving process. Therefore, there is a need for an effective data processing circuit and method for completing such process. In addition, circuit and system performance can be further enhanced given the data processing circuit and method are capable of simultaneously performing frequency de-interleaving and cell de-interleaving processes.

SUMMARY OF THE INVENTION

It is an object of the present invention to provide a data processing circuit and method and a corresponding address generator for performing a de-interleaving process at a receiving end of a Digital Video Broadcasting-Second Generation Terrestrial (DVB-T2) system.

The present invention discloses a data processing circuit for performing a de-interleaving process in a DVB-T2 system. The data processing circuit includes: a buffer, buffering a plurality of data symbols; a memory, coupled to the buffer; an address generator, generating a plurality of addresses according to an operation logic and a permutation rule, and determining a target address from the addresses; and a memory controller, coupled to the memory, the buffer and the address generator, moving the data symbols according to the target address until the data symbols are de-interleaved when the data symbols are read from the memory.

The present invention further discloses a data processing method for performing a de-interleaving process in a DVB-T2 system. The data processing method includes: a) providing a memory; b) buffering a plurality of data symbols by a buffer; c) generating a plurality of addresses according to an operation logic and a permutation rule, and determining a target address from the addresses; and d) moving the data symbols according to the target address.

In the data processing circuit and method and the corresponding address generator of the present invention, two candidate addresses are generated in one round of operation, and the appropriateness of the candidate addresses is determined to output one of the candidate addresses. In a preferred embodiment, if both of the candidate addresses are appropriate, the candidate address in a previous round and not yet outputted can be directly used in a next round to increase the operation speed. In another preferred embodiment, two candidate addresses are generated in each round, with one of the two being appropriate. Thus, an issue of having to re-calculate the address and hence wasting additional time in the event that only one address is generated in each round and the address is inappropriate can be eliminated.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 1 is a schematic diagram of a data processing circuit according to an embodiment of the present invention;

FIG. 10 is a table showing correspondence among a plurality of parameters according to an embodiment of the present invention.

FIG. 11 is another table showing correspondence among a plurality of parameters according to an embodiment of the present invention.

DETAILED DESCRIPTION OF THE INVENTION

Figure 2A:
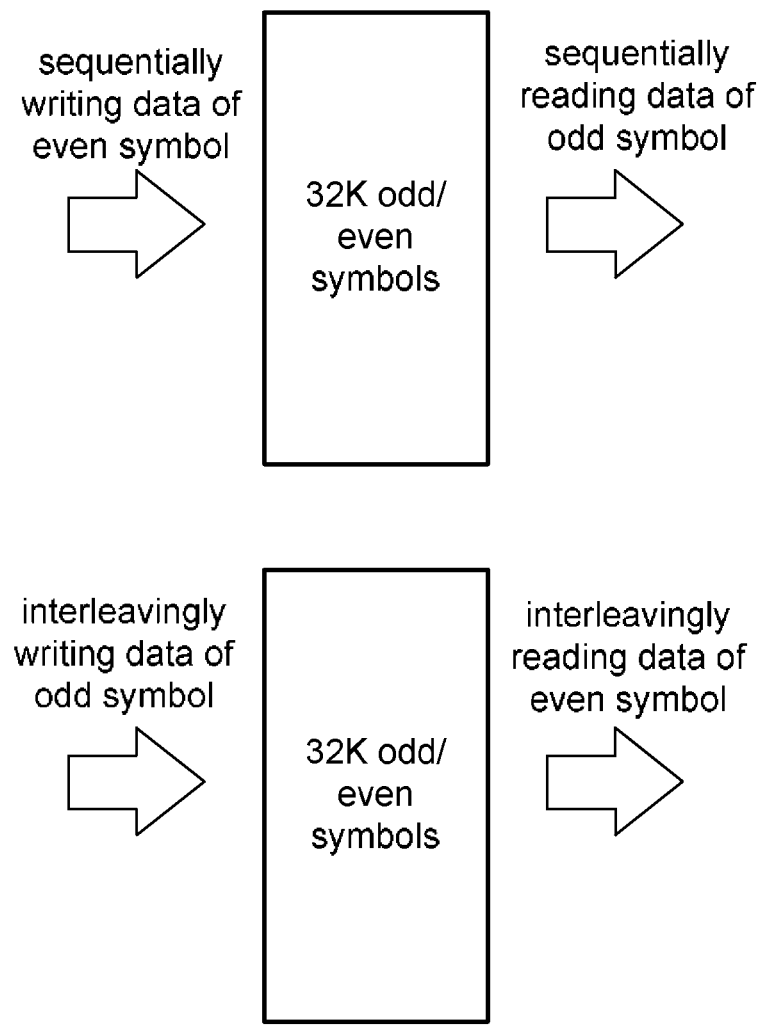
FIG. 2a and FIG. 2b are a schematic diagrams of writing and reading odd symbols and even symbols for different FFT modes.

Technical terms of the application are based on the general definition in the technical field of the application. If the application describes or explains one or some terms, definitions of the terms are based on the description or explanation of the application.

The present invention discloses a data processing circuit and method for performing a de-interleaving process in a Digital Video Broadcasting-Second Generation Terrestrial (DVB-T2) system. In possible implementation, one skilled person in the art may choose equivalent devices or steps to implement the disclosure based on the disclosure of the application. That is, the implementation of the disclosure is not limited in the embodiments described in the disclosure.

FIG. 1 shows a schematic diagram of a data processing circuit according to an embodiment of the present invention. A data processing circuit 100 includes a buffer 110, a memory 120, a memory control unit 130 and an address generator 140. The data processing circuit 100 performs a de-interleaving operation on data symbols and generates de-interleaved output data. The buffer 110, e.g., a first-in-first-out (FIFO) buffer, buffers the data symbols. The address generator 140 generates a plurality of addresses according to a threshold '$N_{data}$' and a configuration value, and outputs a target address after determining the appropriateness of the addresses. The appropriateness here refers to whether the addresses are smaller than the threshold '$N_{data}$' For a frequency de-interleaving process, the configuration value is a Fast Fourier Transform (FFT) mode, e.g., including 1K, 2K, 4K, 8K, 16K and 32K modes, the threshold '$N_{data}$' is the count of available data cells respectively corresponding to the above modes, and attributes of different data symbols under the same mode may have different thresholds. For example, according to DVB-T2 specifications, in the 1K mode, the count of available data cells of a P2 symbol may be 558 (a single-input single-output system) or 546 (a multiple-input single-output system); the count of available data cells of a ordinary symbol may be 764, 768, 798, 804 or 818; the count of available data cells of a frame closing symbol may be 568, 710 or 780. The count of available data cells of other data symbol attributes corresponding to other modes can be found from tables 47 to 49 in the specification document. For a cell de-interleaving process, the configuration value is the sequence number of a forward error correction (FEC) block, and the threshold '$N_{data}$' is the count of cells included in that block. The memory control unit 130, coupled to the buffer 110, the address generator 140 and the memory 120, controls data writing from the buffer 110 to the memory 120 or data reading from the memory 120 according to the target address.

Figure 2B:
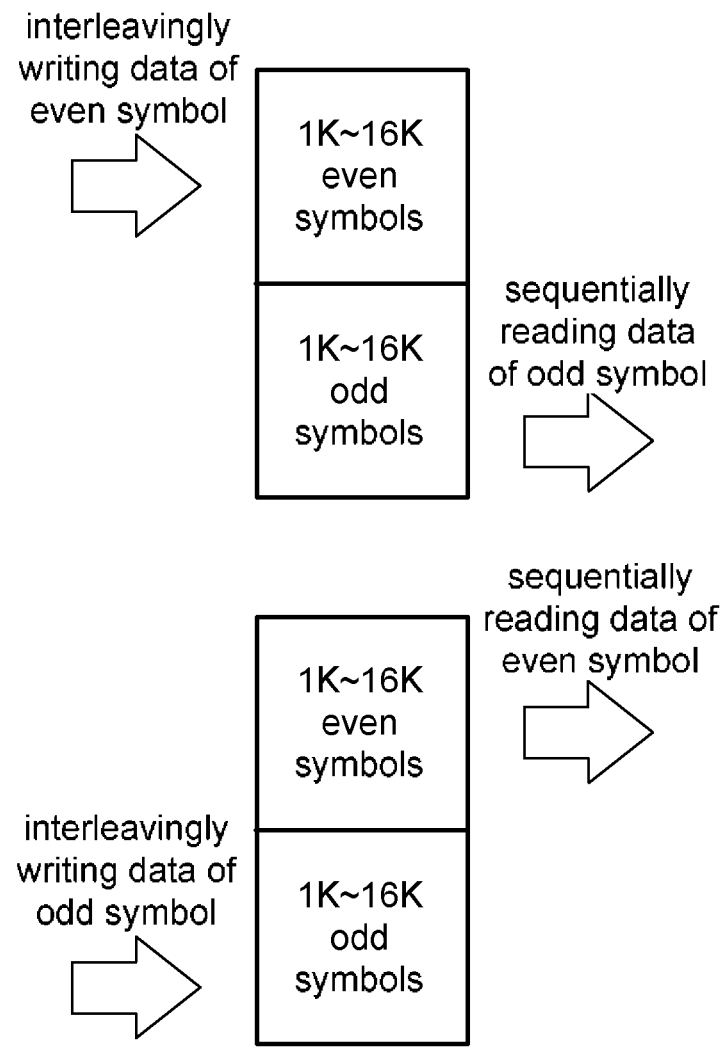

FIG. 2a and FIG. 2b show schematic diagrams of writing and reading odd symbols and even symbols to/from the memory for different FFT modes. In the 32K mode, odd symbols and even symbols share the same memory space. If a data symbol (buffered in the buffer 110) to be written is an even symbol, data of a previous odd symbol is read out sequentially (e.g., in an increasing order), and the data of the even symbol is simultaneously written into the memory according to the same order. If the data symbol to be written is an odd symbol, data of previous even symbol is read out sequentially (e.g., according to an interleaving address generated by the address generator 140), and data of the odd symbol is simultaneously written according to the same interleaving order. In the 1K to 16K modes in FIG. 2b, the respective memory configurations are different from that of 32K, and odd symbol data and even symbol data use different memory spaces. If a data symbol to be written is an even symbol, data of a previous odd symbol is sequentially (e.g., in an increasing order) read out while data of the even symbol is written into the memory in a interleaving fashion. If a data symbol to be written is an odd symbol, data of a previous even symbol is sequentially read while data of the odd symbol is written in the interleaving fashion.

Figure 3:
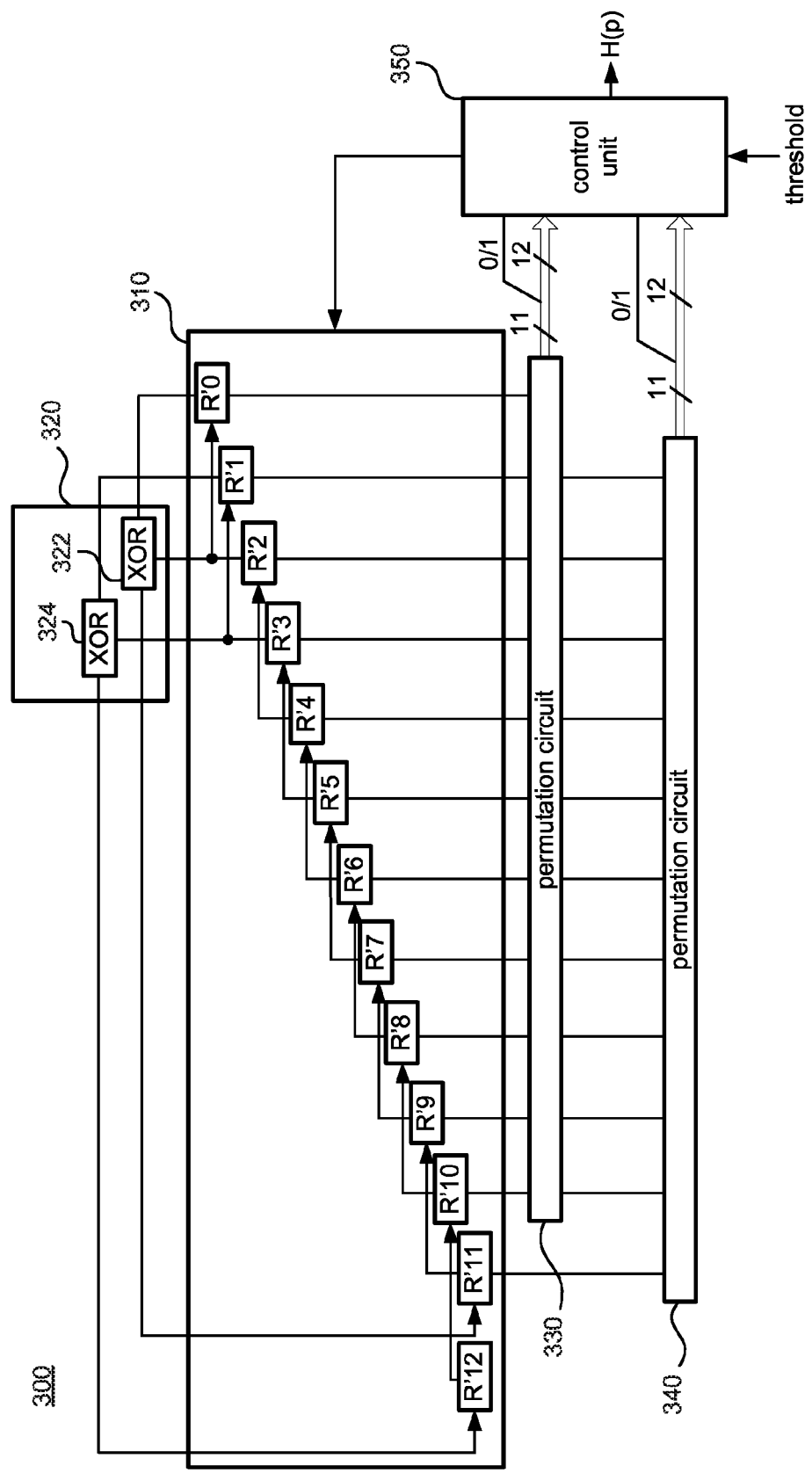
FIG. 3 is a circuit diagram of an address generator according to an embodiment of the present invention.

The circuit of the address generator 140 and the algorithm the address generator 140 uses to generate de-interleaved addresses are described in detail below. FIG. 3 shows a circuit diagram of an address generator according to an embodiment of the present invention. An address generator 300 includes a shift register 310, a logic circuit 320, a permutation circuits 330 and 340, and a control unit 350. In the embodiment, taking a 4K mode for example, the shift register 310 includes 13 register units R'0 to R'12, each of which stores 1-bit of data. Thus, the binary data stored in the shift register 310 includes a total of 13 bits. In each shift, data is shifted by two bits toward lower bits (i.e., data of R'12 is shifted to R'10, data of R'11 is shifted to R'9, and so forth). The logic circuit 320, coupled to the shift register 310, obtains data in a part of the register units for a logic operation to obtain feedback data, and sends the feedback data to the shift register 310. The logic circuit 320 in different modes needs to perform operations according to operation logics in Table-1.

| Mode | $N_r$ | Operation logic |
|---|---|---|
| 1K | 10 | $R_i'[9] = R_i'[0] \oplus R_i'[4]$ |
|  |  | $R_i'[10] = R_i'[1] \oplus R_i'[5]$ |
| 2K | 11 | $R_i'[10] = R_i'[0] \oplus R_i'[3]$ |
|  |  | $R_i'[11] = R_i'[1] \oplus R_i'[4]$ |
| 4K | 12 | $R_i'[11] = R_i'[0] \oplus R_i'[2]$ |
|  |  | $R_i'[12] = R_i'[1] \oplus R_i'[3]$ |
| 8K | 13 | $R_i'[12] = R_i'[0] \oplus R_i'[1] \oplus R_i'[4] \oplus R_i'[6]$ |
|  |  | $R_i'[13] = R_i'[1] \oplus R_i'[2] \oplus R_i'[5] \oplus R_i'[7]$ |
| 16K | 14 | $R_i'[13] = R_i'[0] \oplus R_i'[1] \oplus R_i'[4] \oplus R_i'[5] \oplus R_i'[9] \oplus R_i'[11]$ |
|  |  | $R_i'[14] = R_i'[1] \oplus R_i'[2] \oplus R_i'[5] \oplus R_i'[6] \oplus R_i'[10] \oplus R_i'[12]$ |
| 32K | 15 | $R_i'[14] = R_i'[0] \oplus R_i'[1] \oplus R_i'[2] \oplus R_i'[12]$ |
|  |  | $R_i'[15] = R_i'[1] \oplus R_i'[2] \oplus R_i'[3] \oplus R_i'[13]$ |

The number of the register units in each mode is Nr+1. Thus, the logic unit 322 in FIG. 3 obtains values of the register units R'0 and R'2 for an XOR operation, and generates and outputs a feedback value to the register unit R'11. The logic unit 324 obtains values of the register units R'1 and R'3 for an XOR operation, and generates and outputs a feedback value to the register unit R'12. It is known from the above table that, regardless of the mode, the logic circuit 320 includes two logic units, and the logic units are individually connected to the same number of register units, also, the register units of one of the logic circuits are adjacent to the register units of the other logic circuit. In the embodiment, for example, the register units R'0 and R'2 are adjacent to the register units R'1 and R'3. For another example, in the 16K mode, the register units R'0, R'1, R'4, R'5, R'9 and R'11 are respectively adjacent to the register units R'1, R'2, R'5, R'6, R'10 and R'12.

The permutation circuit 330 is coupled to the register units R'0 to R'10, and the permutation circuit 340 is coupled to the register units R'1 to R'11. The permutation circuits 330 and 340 convert data of the respectively coupled register units according to a permutation method to generate first converted data and second converted data, respectively. The first converted data and the second converted data respectively include 11-bit binary data. The permutation circuit 330 converts data according to Table-2 below. In Table-2, the $1^{st}$ row represents bit positions of data symbols, the $2^{nd}$ row represents positions of converted data symbols that are originally OFDM even symbols, and the $3^{rd}$ row represents positions of converted data symbols that are originally OFDM odd symbols. For example, for an even symbol, the value originally at the $8^{th}$ bit (R'8) is at the $5^{th}$ bit after the conversion, and the odd symbol is at the $7^{th}$ bit.

TABLE 2

| Position of bit of $R'_i$ | 10 | 9 | 8 | 7 | 6 | 5 | 4 | 3 | 2 | 1 | 0 |
|---|---|---|---|---|---|---|---|---|---|---|---|
| Position of bit of $R_{i,a}$ ($H_0$) | | 7 | 10 | 5 | | 8 | 1 | 2 | 4 | 9 | 0 | 3 | 6 |
| Position of bit of $R_{i,a}$ ($H_1$) | | 6 | 2 | 7 | 10 | 8 | 0 | 3 | 4 | 1 | 9 | 5 |

The permutation circuit 340 converts data according to Table-3.

| Position of bit of $R'_i$ | 11 | 10 | 9 | 8 | 7 | 6 | 5 | 4 | 3 | 2 | 1 |
|---|---|---|---|---|---|---|---|---|---|---|---|
| Position of bit of $R_{i,b}$ ($H_0$) | | 7 | 10 | 5 | | 8 | 1 | 2 | 4 | 9 | 0 | 3 | 6 |
| Position of bit of $R_{i,b}$ ($H_1$) | | 6 | 2 | 7 | 10 | 8 | 0 | 3 | 4 | 1 | 9 | 5 |

Next, the control unit 350 adds 1-bit data (respectively binary 0 and binary 1) to a most significant bit (MSB) of the first converted data and to an MSB of the second converted data to generate first and second candidate addresses (12-bit), respectively. The control unit 350 further determines whether the first and second candidate addresses are appropriate, that is, the control unit 350 determines whether the first and second candidate addresses are smaller than the threshold '$N_{data}$', and eventually outputs the target address H(p).

The control circuit 350 in the embodiment in FIG. 3 may control the process for generating the target address H(p) according to two algorithms below.

Algorithm 1:

```
p = 0;i = 0;R' [0,1, . . . ,N_r - 2] = [0,0, . . . ,0]
while(i < M_max && p < N_data) {
  if (p == 2)
    R'[0,1, . . . ,N_r - 2] = [1,0, . . . ,0];
  if ( mod(i,2) == 0) {
    calculate R'_i (Nr - 1), R'_i (Nr);
    H_a = R_a;
    H_b = 2^{Nr-1} + R_b;
    H(p) = H_a
    if(H_b < N_data)
      i = i + 1;
    else
      i = i + 2;
    R' [0,1, . . . ,N_r - 2] = R' [2,3, . . . ,N_r];
  }
  else{
    H(p) = H_b;
    i = i +1;
  }
  p = p + 1;
}
where  $R_a = \sum_{j=0}^{N_r-2} R_{i,a}(j)*2^j$,  $R_b = \sum_{j=0}^{N_r-2} R_{i,b}(j)*2^j$
```

Figure 4:
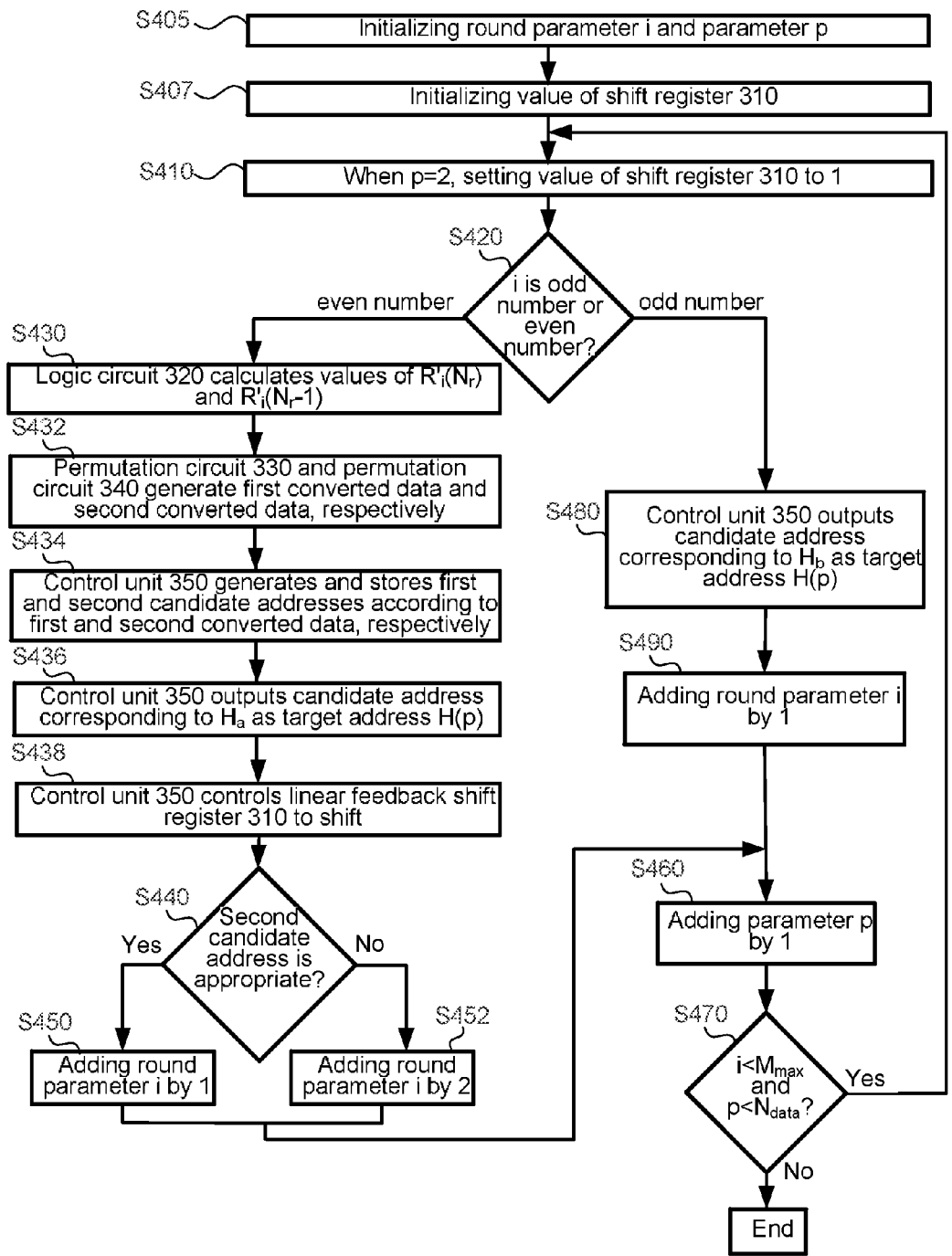
FIG. 4 is a flowchart of an algorithm of an address generating method of the present invention.

FIG. 4 shows a flowchart of one algorithm of the above address generation method. The address generation method in FIG. 4 may be performed by the address generator 300 in FIG. 3. The above algorithm may be concluded to a process including following steps.

In step S405, a round parameter i and a parameter p are initialized to be 0. The round parameter i is for controlling iteration operations in the algorithm, and the value of the parameter p is 0 to ($N_{data}-1$).

In step S407, the value of the shift register 310 is initialized. When p<2, the value of the shift register 310 is set to be 0 (i.e., filling the values of all of the register units R'0 to R'12 to 0).

In step S410, when p=2, the value of the initialized shift register 310 is set to be 1 (i.e., filling the values of the register units R'1 to R'12 to 0, while filling the value of the register unit R'0 to 1).

In step S420, the control unit 350 determines whether the parameter i is an odd number or an even number. If the parameter i is an even number, step S430 is performed, if the parameter i is an odd number, step S480 is performed.

In step S430, the logic circuit 320 calculates values of $R'_i(N_r)$ and $R'_i(N_r-1)$. In this embodiment, for example, the logic unit 322 performs an XOR operation on the values of R'0 and R'2, and stores the result to R'11; the logic unit 324 performs an XOR operation on the values of R'1 and R'3 and stores the result to R'12.

In step S432, the permutation circuit 330 converts the values of part of the register units (11 bits) of the shift register 310 according to permutation methods (i.e., Table-2 and Table-3) to generate first converted data (11-bit, having a value $R_a$); the permutation circuit 340 converts the values of part of the register units (11 bits) of the shift register 310 to generate second converted data (11-bit, having a value $R_b$).

In step S434, the control unit 350 adds 1-bit data (data 0) to the MSB of the first converted data to form a first candidate address (12-bit, having a value $H_a$), adds 1-bit data (data 1) to the MSB of the second converted data to form a second candidate address (12-bit, having a value $H_b$), and stores the first candidate address and the second candidate address. It is apparent that $H_b>H_a$.

In step S436, the control unit 350 outputs the candidate address corresponding to $H_a$ to be the target address H(p). According to the specification document, the threshold $N_{data}$ is essentially larger than $2^{Nr-1}$, and $R_a$ and $R_b$ are smaller than $2^{Nr-1}$, and thus the control unit 350 may directly output the corresponding candidate address as the target address H(p) without determining whether $H_a$ is smaller than $N_{data}$.

In step S438, the control unit 350 controls shifting of the shift register 310. In the embodiment, in each shift, the value of the shift register 310 shifts by two register units.

In step S440, the control unit 350 determines whether the second candidate address is appropriate, i.e., determining whether $H_b$ is smaller than the threshold $N_{data}$. If $H_b$ is smaller than the threshold $N_{data}$, Step S450 is performed, if $H_b$ is not smaller than the threshold $N_{data}$, step S452 is performed.

The control unit 350 adds the round parameter i by 1, and the round parameter i becomes an odd number.

In step S452, the control unit 350 adds the round parameter i by 1, and the round parameter i becomes an even number.

In step S460, the control unit 350 adds the parameter p by 1.

In step S470, it is determined whether the round parameter i is smaller than a maximum value $M_{max}$ ($=2^{Nr}$), and whether the parameter p is smaller than the threshold $N_{data}$. If the round parameter i is smaller than the maximum value $M_{max}$ and the parameter p is smaller than the threshold $N_{data}$, it means that the de-interleaving process is not yet complete and so step S410 is iterated, or else the process ends.

In step S480, the control unit 350 outputs the candidate address corresponding to $H_b$ as the target address H(p). When in step S440 it is determined that the second candidate address is appropriate, the round parameter i is added by 1 (step S450) so that the next round parameter is an odd number, and thus step S480 is performed to output the second candidate address generated in the previous round as the target address.

In step S490, the control unit 350 adds the round parameter i by 1.

In step S440 above, the control unit 350 determines whether the candidate address having a larger value is appropriate, i.e., whether $H_b$ is smaller than the threshold $N_{data}$. If the candidate address is appropriate then the candidate address can be adopted; if the candidate address is larger than the threshold $N_{data}$, i.e., not appropriate, then it cannot be adopted. If the candidate address is appropriate, in step S450 the control unit 350 adds the round parameter i by 1 (the round parameter i becomes an odd number), and then in step 480, the candidate address generated in the previous round is directly outputted. However, if the candidate address is not appropriate, in step S452 the control unit 350 adds the round parameter i by 2 (so that the round parameter i becomes an even number), and the steps of performing an even-number round (step S430 to step S438) are performed in the next round. That is, in the embodiment, in the odd-number round, the control unit 350 does not generate a new candidate address nor does shift the shift register 310; in the even-number round, the control unit 350 controls the shift register 310 to shift (step S438), such that the permutation circuits 330 and 340 generate new converted data to further generate new candidate addresses.

FIG. 10 shows correspondence of the round parameter i, the parameter p, $H_a$, $H_b$ and the target address H(p) of the method in the case that the threshold $N_{data}$ is equal to 1118 for OFDM even symbols in a 2K mode according to an embodiment.

As shown in FIG. 10, in the embodiment, when the round parameter i is 0, 2 and 4 (even-number round), two candidate addresses (respectively having values $H_a$ and $H_b$) are generated, respectively, and the smaller value ($H_a$) of the two is outputted as the target address H(p), and then, the other candidate address is outputted in the next round (when the parameters i is 1, 3 and 5, odd-number round) as $H_b$ is smaller than $N_{data}$ (=1118). When the parameter round i is 6, the candidate address corresponding to $H_a$ is outputted in the current round. However, as $H_b$ (=1280) is greater than $N_{data}$ (=1118) in the current round, $H_b$ is not adopted in the current round. Thus, the round parameter i=7 is skipped so that the candidate address corresponding to $H_b$ is omitted, and the parameter i of the next round is set to 8 to generate two new candidate addresses.

The second algorithm is described below.

Algorithm 2:

```
p = 0; i = 0; R' [0,1, . . . ,N_r - 2] = [0,0, . . . ,0]
while(i < M_max && p < N_data) {
    if (p == 2) {R' [0,1, . . . ,N_r - 2] = [1,0, . . .
,0];}
    if (p == 3) {R' [0,1, . . . ,N_r - 2] = [0,0, . . .
,1];}
    if (p ≤ 2){
        H(p) = (i mod 2)*2^{N_r−1} + R_a;
        i = i + 1;
    } else{
        if ( mod(i,2) == 1 ) {
            calculate R'_i (Nr − 1), R'_i (Nr);
            H_a = 2^{N_r−1} + R_a; H_b = R_b;
            if(H_a < N_data) {
                H(p) = H_a;   i = i + 1;
            }else{
                H(p) = H_b;   i = i + 2;
            }
            R' [0,1, . . . ,N_r - 2] = R' [2,3, . . . ,N_r];
        }else{
            H(p) = H_b;   i = i + 1;
        }
    }
```

Algorithm 2:
-continued

Figure 5A:
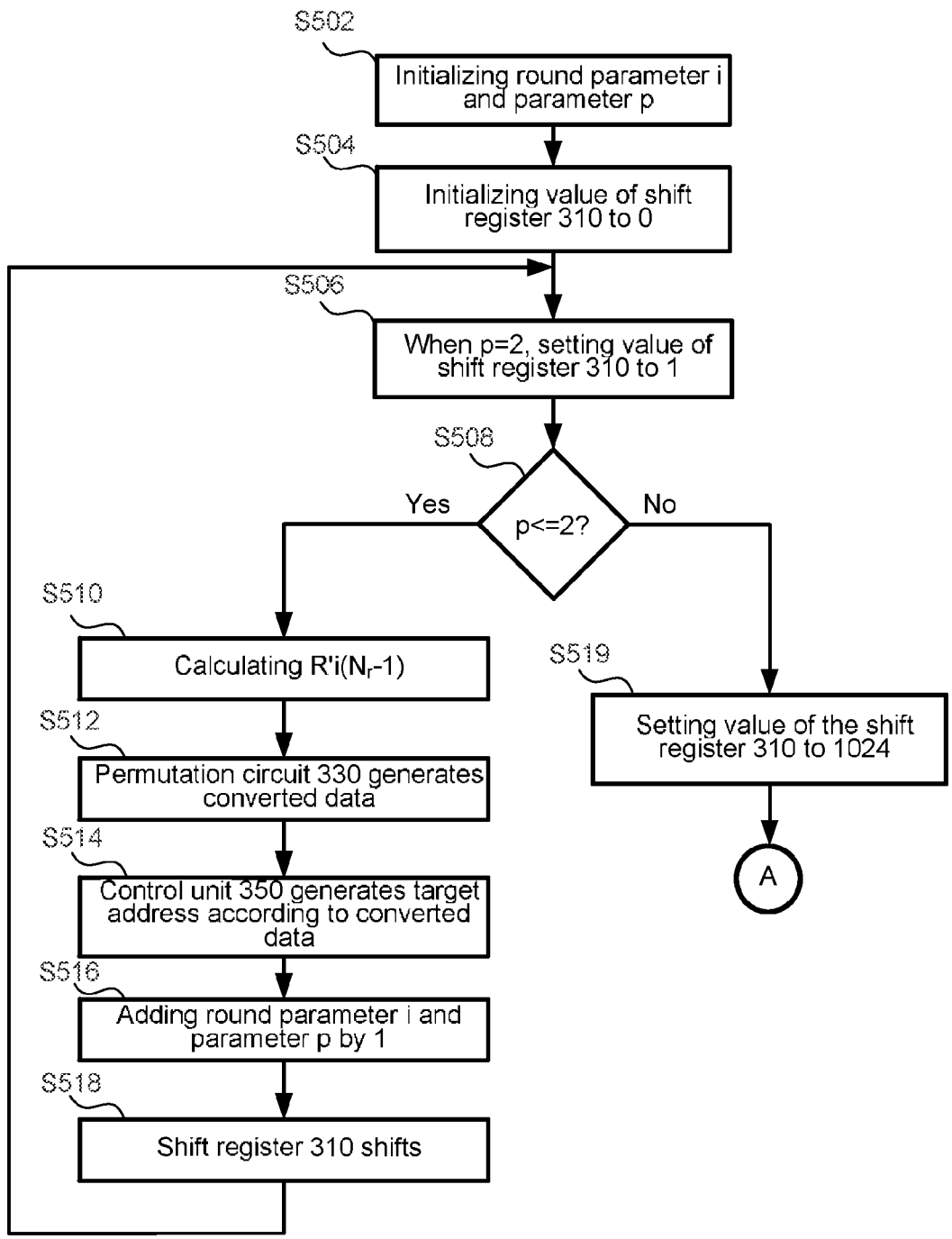
FIG. 5a and FIG. 5b are a flowchart of an algorithm of another address generating method of the present invention.
Figure 5B:
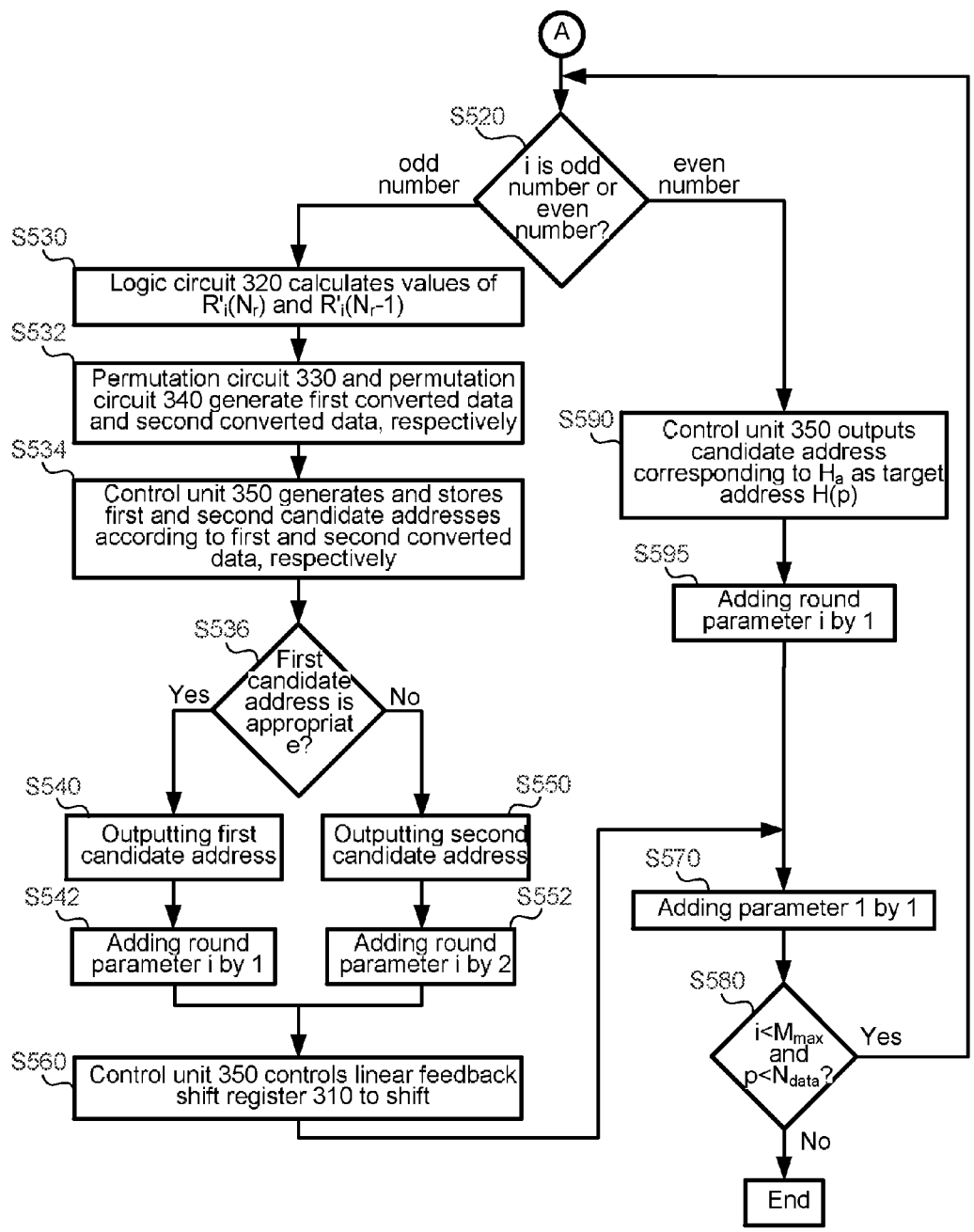

```
    }
    p = p + 1;
}
``` where $R_a = \sum_{j=0}^{N_r-2} R_{i,a}(j)*2^j$, $R_b = \sum_{j=0}^{N_r-2} R_{i,b}(j)*2^j$ FIG. 5a and FIG. 5b show a flowchart of the algorithm of the above address generating method. The address generating method in FIG. 5a and FIG. 5b may be performed by the address generator 300 in FIG. 3. The above algorithm may be concluded into following steps.

In step S502, the round parameter i and the parameter p are initialized to be 0. The round parameter i controls iteration operations in the algorithm, and the value of the parameter p is 0 to ($N_{data}$−1).

In step S504, the value of the shift register 310 is initialized. When p<2, the value of the shift register 310 is set to be 0 (i.e., values of all of the register units R'0 to R'12 are filled as 0).

In step S506, when p=2, the value of the shift register 310 is set to be 1 (i.e., the values of the register units R'1 to R'12 are filled as 0, and the value of the register unit R'0 is filled as 1).

In step S508, it is determined whether p is smaller than or equal to 2. Step S510 is performed if so, or else step S520 is performed.

In step S510, $R'_i(N_r-1)$ is calculated by the logic circuit according to Table-1. In this embodiment, for example, the logic unit 322 performs an XOR operation on the values of the register units R'0 and R'2 to obtain R'11.

In step S512, the permutation circuit 330 converts the values of a part of the register units (11 bits) of the shift register 310 according to the permutation method (i.e., the rules in foregoing Table-2) to generate converted data (11-bit, having a value $R_a$).

In step S514, the control unit 350 adds 1-bit data (data 0 or data 1) to the MSB of the converted data according to the round parameter i to form a first candidate address (12-bit), and outputs the candidate address as a target address. When the round parameter i is 1, the control unit 350 adds 1-bit data (data 1) to the MSB of the converted data; when the round parameter i is 0 or 2, the control unit 350 adds 1-bit data (data 0) to the MSB of the converted data.

In step S516, the round parameter i is added by 1, and the parameter p is added by 1.

In step S518, the control unit 350 controls the shift register 310 to shift by two register bits, and then the flow proceeds back to step S506.

In step S519, the value of the shift register 310 is set to 1024 (i.e., the values of the register units R'0 to R'9 are filled as 0, and the value of the register unit R'10 is filled as 1).

In step S520, the control unit 350 determines whether the round parameter i is an odd number of an even number. Step S530 is performed if the round parameter i is an odd number, and step S590 is performed if the round parameter i is an even number.

In step S530, the logic circuit 320 calculates values of $R'_i(N_r)$ and $R'_i(N_r-1)$. In this embodiment, for example, the logic unit 322 performs an XOR operation on the values of R'0 and R'2, and stores the result to R'11; the logic unit 324 performs an XOR operation on the values of R'1 and R'3, and stores the result to R'12.

In step S532, the permutation circuit 330 converts the values of a part of the register units (11 bits) of the shift register 310 according to the permutation method (i.e., the foregoing Table-2) to generate first converted data (11-bit, having a value $R_a$); the permutation circuit 340 converts the values of a part of the register units (11 bits) of the shift register 310 according to the permutation method (i.e., the foregoing Table-3) to generate second converted data (11-bit, having a value $R_b$).

In step S534, the control unit 350 adds 1-bit data (data 1) to the MSB of the first converted data to form a first candidate address (12-bit, having a value $H_a$), and adds 1-bit data (data 0) to the MSB of the second converted data to form a second candidate address (12-bit, having a value $H_b$). As $R_a$ and $R_b$ are both smaller than $2^{Nr-1}$, also $H_a=2^{Nr-1}+R_a$ and $H_b=R_b$, it is apparent that $H_a>H_b$. Therefore, the second candidate address corresponding to $H_b$ is essentially an appropriate address, and so this step at least generates one appropriate candidate address.

In step S536, the control unit 350 determines whether the first candidate address is appropriate, i.e., determining whether $H_a$ is smaller than the threshold $N_{data}$. Step S540 is performed if the first candidate address is appropriate, or else step S550 is performed.

In step S540, the control unit 350 outputs the first candidate address.

In step S542, the round parameter i is added by 1 (the round parameter i becomes an even number).

In step S550, the control unit 350 outputs the second candidate address.

In step S552, the round parameter i is added by 2 (the round parameter i becomes an odd number).

In step S560, the shift register 310 is controlled to shift. In the embodiment, in each shift, the value of the shift register 310 is shifted by two register units.

In step S570, the control unit 350 adds the parameter p by 1.

In step S580, it is determined whether the round parameter i is smaller than the maximum value $M_{max}$ (=$2^{Nr}$), and whether the parameter p is smaller than the threshold $N_{data}$. If the round parameter i is smaller than the maximum value $M_{max}$ and the parameter p is smaller than the threshold $N_{data}$, it means the de-interleaving process is not yet complete, and the process proceeds to step S520. Else, the process ends.

In step S590, the second candidate address generated in the previous round is outputted.

In step S595, the round parameter i is added by 1.

In step S536, the control unit 350 determines whether the candidate address in a larger value is appropriate. If so, both of the two candidate addresses are determined appropriate and can be adopted. If not, only the candidate address in a smaller value is appropriate. If the candidate address of larger value is appropriate, the control unit 350 outputs this candidate address as the target address (step S540), and causes the round parameter i to be added by 1 (step S542) (the round parameter i becomes an even number), and the candidate address of smaller value generated in this round is outputted in the next round in step S590 without other calculations. However, if the candidate address of larger value is not appropriate (only the smaller is appropriate) in the present round, the control unit 350 outputs the candidate address of smaller value as the target address (step S550), and causes the round parameter i to be added by 2 (step S552) (so that the round parameter i becomes an odd number), and the steps for an odd-number round (steps S530 to S560) are performed in the next round. That is to say, in the embodiment, in an even-number round, the control unit 350 does not generate a new candidate address nor does it control the shift register 310 to shift; meanwhile, in an odd-number round, the control unit 350 controls the shift register 310 to shift (step S560) to cause the permutation circuits 330 and 340 to generate new converted data to further generate new candidate addresses.

FIG. 11 shows correspondence of the round parameter i, the parameter p, $H_a$, $H_b$ and the target address H(p) of the method when the threshold $N_{data}$ is equal to 1118 for OFDM even symbols in a 2K mode according to an embodiment.

When the round parameter i is 0, 1, and 2, steps S506 to 518 are performed to generate one address as the target address in each round. When the round parameter i is 3 and 5, two candidate addresses are generated in each round (in values $H_a$ and $H_b$), and the larger of the two is outputted as the target address H(p). Further, in the next round (the round parameter is 4 and 6), the other candidate address is outputted (as $H_b$ is smaller than $N_{data}$). When the round parameter i is 7, as Ha (=1280) is greater than $N_{data}$ (=1118) in this round, the candidate address corresponding to $H_b$ is outputted instead. Further, in this round (i=7), because no appropriate address is generated in advance for the round where the parameter i=8, the round parameter i=8 is skipped and the round parameter i is caused to become 9 to generate two new candidate addresses.

It should be noted that, according to the specification document, the relationship $R'_{i+1}=F\times R'_i$ (taking 4K mode for example) between the value $R'_{i+1}$ of the shift register of the next round and the value $R_i$ of the shift register of the current round is as follows:

$$\begin{bmatrix} R'_{i+1}(0) \\ R'_{i+1}(1) \\ R'_{i+1}(2) \\ \vdots \\ R'_{i+1}(9) \\ R'_{i+1}(10) \end{bmatrix} = \begin{bmatrix} 0 & 1 & 0 & 0 & \cdots & 0 \\ 0 & 0 & 1 & 0 & \cdots & 0 \\ 0 & 0 & 0 & 1 & \cdots & 0 \\ & & \vdots & & & \\ & & \vdots & & & \\ 0 & 0 & 0 & 0 & \cdots & 1 \\ 1 & 0 & 1 & 0 & \cdots & 0 \end{bmatrix} \begin{bmatrix} R'_i(0) \\ R'_i(1) \\ R'_i(2) \\ \vdots \\ R'_i(9) \\ R'_i(10) \end{bmatrix}$$

However, in this embodiment, the shift register 310 shifts by two register units in each shift, and so the relationship $R'_{i+1}=F\times F\times R'_i=F^2\times R'_i$ between the value $R'_{i+1}$ of the shift register of the next round and the value $R_i$ of the shift register of the current round is as follows:

$$\begin{bmatrix} R'_{i+1}(0) \\ R'_{i+1}(1) \\ R'_{i+1}(2) \\ \vdots \\ R'_{i+1}(9) \\ R'_{i+1}(10) \end{bmatrix} = \begin{bmatrix} 0 & 0 & 1 & 0 & \cdots & 0 \\ 0 & 0 & 0 & 1 & \cdots & 0 \\ 0 & 0 & 0 & 0 & \cdots & 0 \\ & & \vdots & & & \\ & & \vdots & & & \\ 1 & 0 & 1 & 0 & \cdots & 0 \\ 0 & 1 & 0 & 1 & \cdots & 0 \end{bmatrix} \begin{bmatrix} R'_i(0) \\ R'_i(1) \\ R'_i(2) \\ \vdots \\ R'_i(9) \\ R'_i(10) \end{bmatrix}$$

Figure 6:
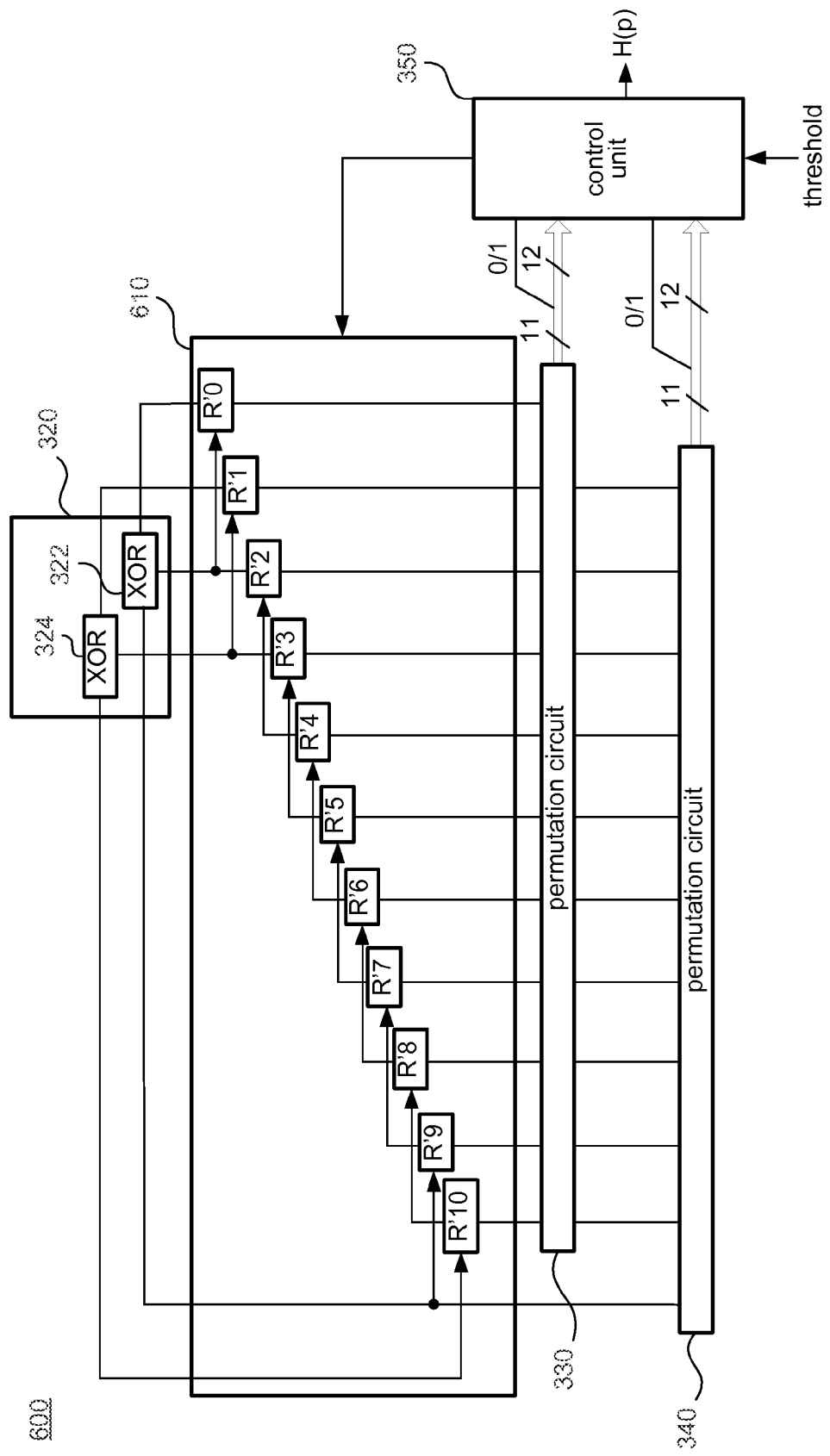
FIG. 6 is a circuit diagram of an address generator according to another embodiment of the present invention.

That is, the value of the register unit $R'_{i+1}(9)$ of the next round is a result of an XOR operation on the register unit $R'_i(0)$ and the register unit $R'_i(2)$ of the current round, the value of the register unit $R'_{i+1}(10)$ of the next round is a result of an XOR operation on the register unit $R'_i(1)$ and $R'_i(3)$ of the current round, and each of the values of other register units of the next round is a result of two shifted register units of the current round. Thus, the circuit in FIG. 3 may be further simplified into the circuit shown in FIG. 6. FIG. 6 shows a circuit diagram of an address generator according to another embodiment of the present invention. The shift register 310 in FIG. 3 is simplified into a shift register 610 according to the above equations. Thus, the quantity of register units can be reduced to lower costs and complexity level of the circuit. It should be noted that, the output of the logic unit 322 is directly coupled to the permutation circuit 340. That is, the permutation circuit 340 obtains and computes a total of 11-bit data including 10-bit data of the register units R'1 to R10 and 1-bit data outputted from the logic unit 322. The output of the logic unit 324 is switched to be coupled to the register unit R'10.

Figure 7:
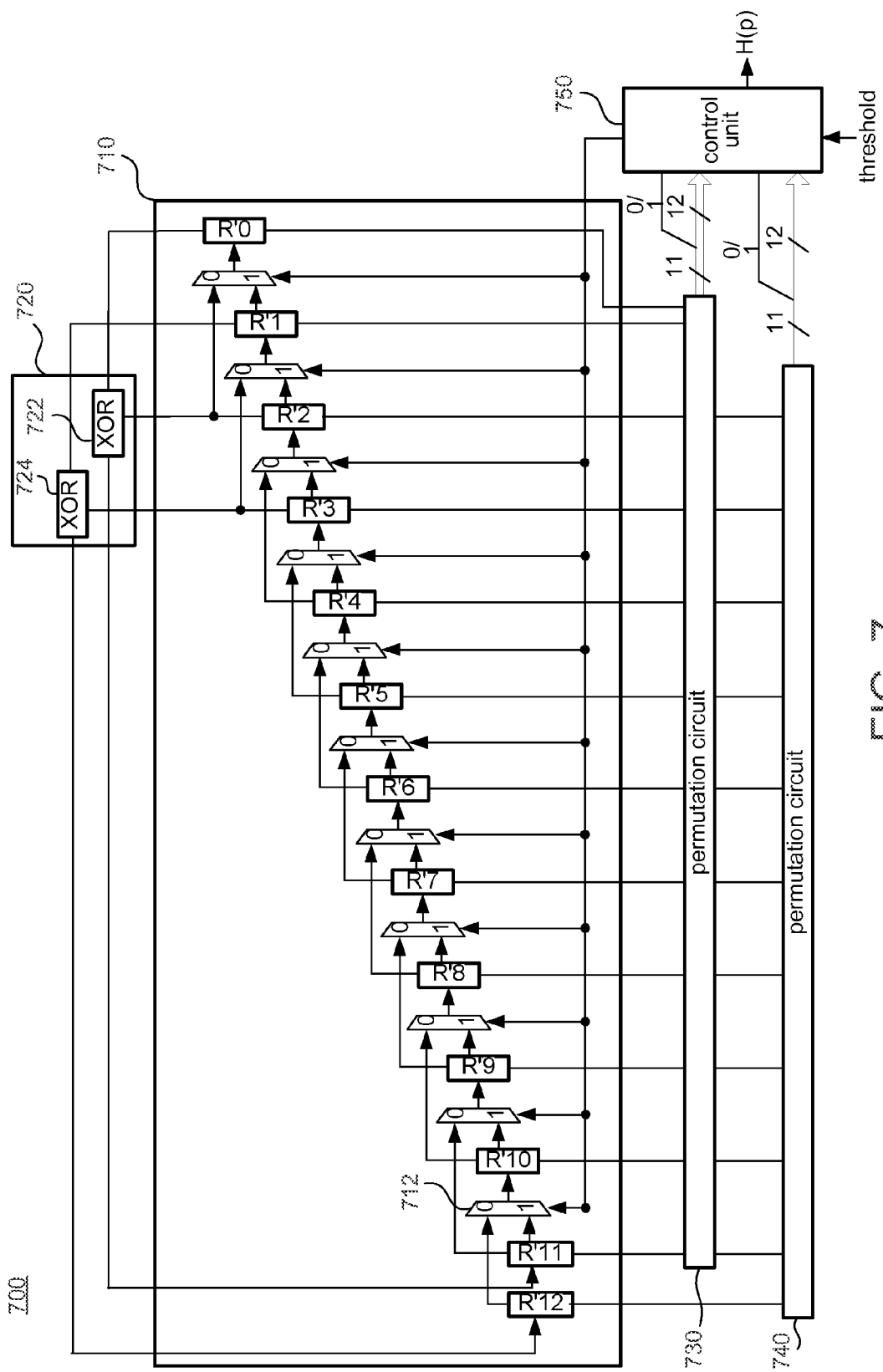
FIG. 7 is a circuit diagram of an address generator according to another embodiment of the present invention.

FIG. 7 shows a circuit diagram of an address generator according to another embodiment of the present invention. An address generator 700 includes a shift register 710, a logic circuit 720, permutation circuits 730 and 740, and a control unit 750. A 4K mode is similarly taken as an example in this embodiment. The shift register 710 includes 13 register units (R'0 to R'12) and 11 multiplexers (MUX) 712. Each of the multiplexers 712 selects the value of the next register unit or the value of the second next register unit, and sends the value to the register unit coupled to its output end. In overall, as the multiplexers 712 are added, the shift register 710 is capable of selectively shifting data from higher bits to lower bits by one register unit or two register units in each shift. The logic circuit 720, coupled to the shift register 710, obtains data from a part of the register units for a logic operation to obtain feedback data, and sends the feedback data to the shift register 710. The logic circuit 720 similarly performs logic operations according to Table-1. Similarly, in this embodiment, the register units coupled to the logic units 722 and the register units coupled to the logic unit 724 are adjacent to one another, i.e., R'0 and R'2 are respectively adjacent to R'1 and R'3.

The permutation circuit 730 is coupled to the register units R'0 to R'11, and the permutation circuit 740 is coupled to the register units R'2 to R'12. The permutation circuits 730 and 740 convert data of the register units respectively coupled thereto according to the permutation methods to generate first converted data and second converted data, respectively. Each of the first data and the second data includes 11-bit binary data. The permutation circuits 730 and 740 convert data according to Table-6 below.

When p is smaller than or equal to 2, in each round, only the permutation circuit 730 converts data of the register units R'0 to R'10 according to the rules in Table-6 to generate converted data (11-bit). When p is greater than 2, in each round, the permutation circuit 730 and the permutation circuit 740 simultaneously generate converted data according to the rules in Table-6. At this point, the permutation circuit 730 uses the data of the register units R'1 to R'11 to generate first converted data (11-bit), and the permutation circuit 740 uses the data of the register units R'2 to R'12 to generate second converted data (11-bit). The control unit 750 then adds 1-bit data to the MSBs of the first converted data and the second converted data to form a first candidate address (12-bit) and a second candidate address (12-bit), respectively, and selects one of the two candidate addresses as the target address H(p).

The control circuit 750 may control a process for generating the target address H(p) according to an algorithm below.

Algorithm:

$p = 0; i = 0; R'[0,1,\ldots,N_r - 2] = [0,0,\ldots,0]$
while($i < M_{max}$ && $p < N_{data}$){
  if ($p \leq 2$){
    if ($p == 2$) {$R'[0,1,\ldots,N_r - 2] = [1,0,\ldots,0]$};

$$H(p) = (i \bmod 2)*2^{N_r-1} + \sum_{j=-}^{N_r-2} R_i(j)*2^j;$$

calculate $R'_i$ (Nr – 1), $R'_i$ (Nr)
    i = i + 1;
  } else{
    $H_a = (i \bmod 2)*2^{N_r-1} + R_a$;
    $H_b = ((i + 1) \bmod 2)*2^{N_r-1} + R_b$;
    if($H_a < N_{data}$){
      H(p) = $H_a$
      $R'_i [0,1,\ldots,N_r - 2] = R'_{i-1} [1,2,\ldots,N_r - 1]$;
      calculate $R'_i$ (Nr – 1), $R'_i$ (Nr)
      i = i + 1;
    }else{
      H(p) = $H_b$
      $R'_{i+1} [0,1,\ldots,N_r - 2] = R'_{i+1} [2,3,\ldots,N_r]$;
      calculate $R'_{i+1}$ (Nr – 1), $R'_{i+1}$ (Nr)
      i = i + 2;
    }
  }
  p = p + 1;
} where $R_a = \sum_{j=0}^{N_r-2} R_{i-1,a}(j)*2^j$, $R_b = \sum_{j=0}^{N_r-2} R_{i-1,b}(j)*2^j$

TABLE 6

| | | | | | | | | | | | | |
|---|---|---|---|---|---|---|---|---|---|---|---|---|
| p <= 2 | Position of bit of $R'_i$ | 10 | 9 | 8 | 7 | 6 | 5 | 4 | 3 | 2 | 1 | 0 |
| | Position of bit of $R_i$ ($H_0$) | 7 | 10 | 5 | 8 | 1 | 2 | 4 | 9 | 0 | 3 | 6 |
| | Position of bit of $R_i$ ($H_1$) | 6 | 2 | 7 | 10 | 8 | 0 | 3 | 4 | 1 | 9 | 5 |
| p > 2 | Position of bit of $R'_{i-1}$ | 11 | 10 | 9 | 8 | 7 | 6 | 5 | 4 | 3 | 2 | 1 |
| | Position of bit of $R_{i-1, a}$ ($H_0$) | 7 | 10 | 5 | 8 | 1 | 2 | 4 | 9 | 0 | 3 | 6 |
| | Position of bit of $R_{i-1, a}$ ($H_1$) | 6 | 2 | 7 | 10 | 8 | 0 | 3 | 4 | 1 | 9 | 5 |
| | Position of bit of $R'_{i-1}$ | 12 | 11 | 10 | 9 | 8 | 7 | 6 | 5 | 4 | 3 | 2 |
| | Position of bit of $R_{i-1, b}$ ($H_0$) | 7 | 10 | 5 | 8 | 1 | 2 | 4 | 9 | 0 | 3 | 6 |
| | Position of bit of $R_{i-1, b}$ ($H_1$) | 6 | 2 | 7 | 10 | 8 | 0 | 3 | 4 | 1 | 9 | 5 |

Figure 8A:
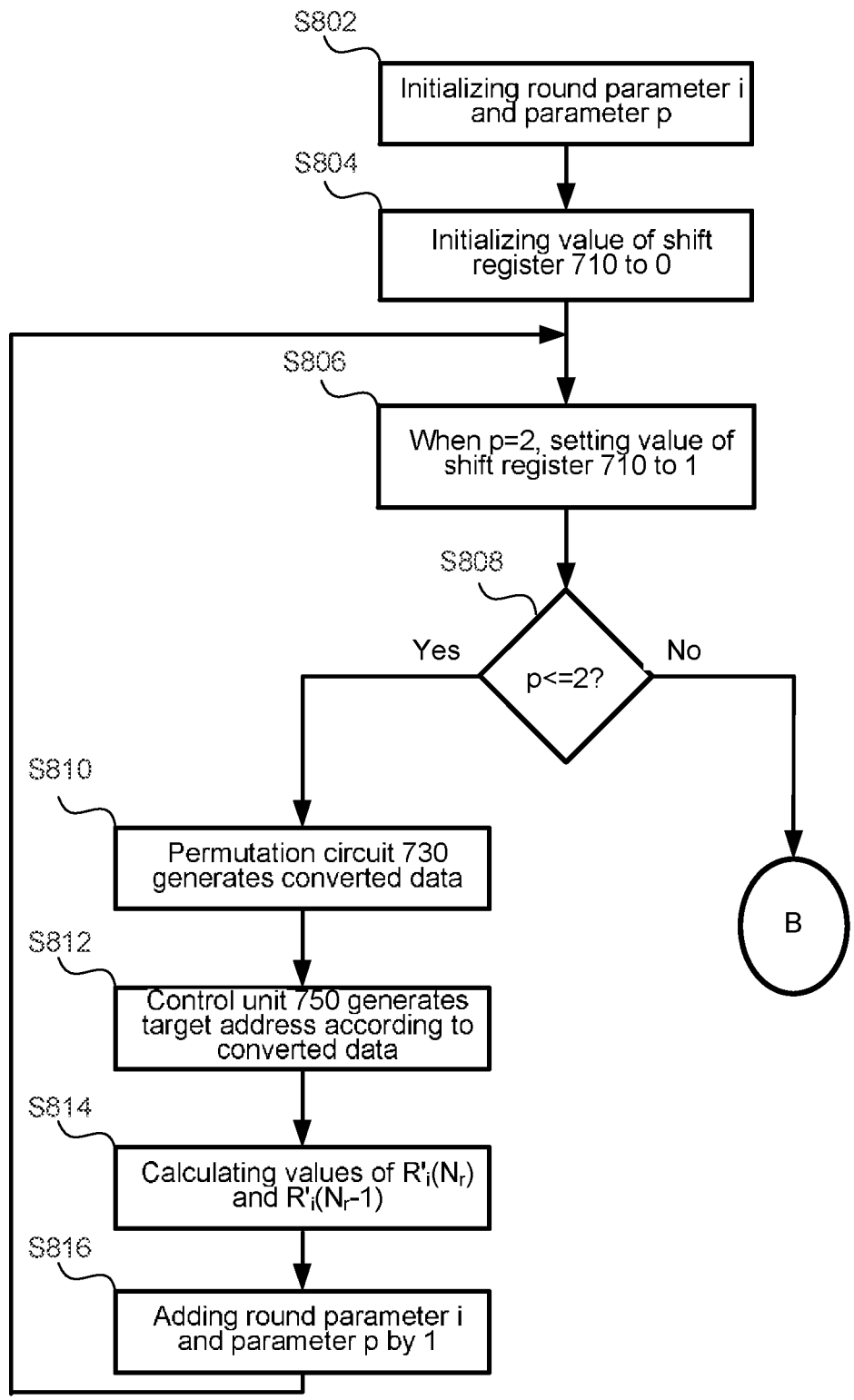
FIG. 8a and FIG. 8b are a flowchart of an algorithm of another address generating method of the present invention.
Figure 8B:
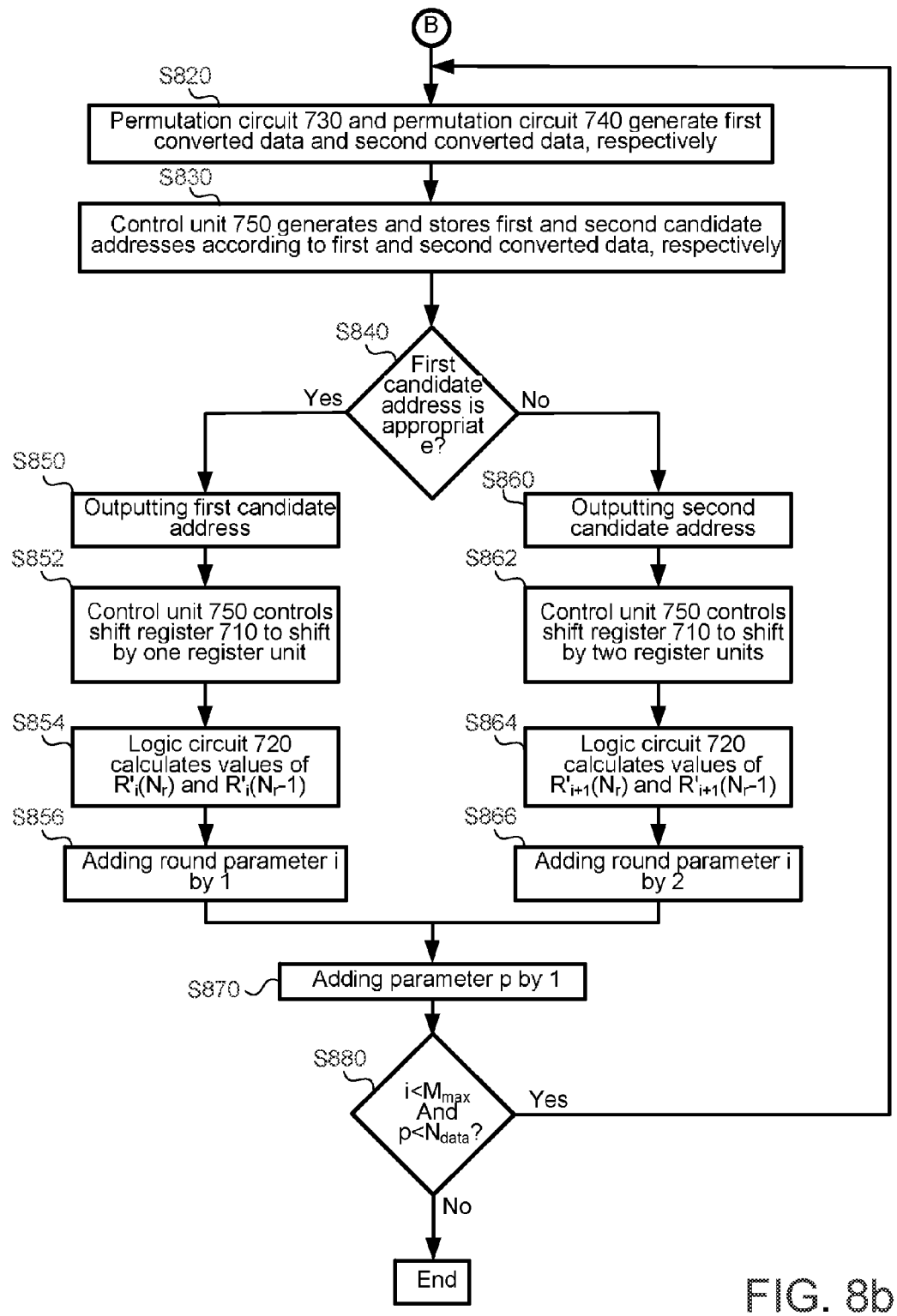

FIG. 8 shows a flowchart of an algorithm of the above address generation method. The address generation method may be performed by the address generator 700 in FIG. 7. The above algorithm may be concluded into following steps.

In step S802, the round parameter i and the parameter p are initialized to be 0. The round parameter i controls iteration operations in the algorithm, and the value of the parameter i is 0 to ($N_{data}-1$).

In step S804, the value of the shift register 710 is initialized to cause the value of the shift register 710 to be 0 (i.e., values of all of the register units R'0 to R'12 are filled as 0).

In step S806, when p=2, the value of the shift register 710 is set to be 1 (i.e., the values of the register units R'1 to R'12 are filled as 0, and the value of the register unit R'0 is filled as 1).

In step S808, it is determined whether p is smaller than or equal to 2. Step S810 is performed if so, or else step S820 is performed.

In step S810, the permutation circuit 730 converts the values of a part of the register units (R'0 to R'10) of the shift register 710 according to a permutation method (i.e., a part where p<=2 in Table-6) to generate converted data (11-bit).

In step S812, the control unit 750 selectively adds 1-bit data (data 0 or data 1) to the MSB of the converted data to generate a target address H(p). When the round parameter i is 1, the control unit 750 adds 1-bit data (data 1) to the MSB of the converted data to generate a 12-bit target address. When the round parameter i is 0 and 2, the control unit 750 adds 1-bit data (data 0) to the MSB of the converted data.

In step S814, the logic circuit 720 calculates values of $R'_i(N_r)$ and $R'_i(N_r-1)$. In this embodiment, for example, the logic units 722 performs an XOR operation on the values of R'0 to R'2, and stores the result to R'11; the logic unit 724 performs an XOR operation on the values of the R'1 and R'3 and stores the result to R'12.

In step S816, the control unit 750 adds the round parameter i and the parameter p by 1, and the process returns to step S806.

In step S820, the permutation circuit 730 converts the values of a part of the register units (R'1 to R'11) of the shift register 710 according to the permutation method (where p>2 in Table-6) to generate first converted data (11-bit, having a value $R_a$), and the permutation circuit 740 converts the values of a part of the register units (R'2 to R'12) of the shift register 710 according to the permutation method to generate second converted data (11-bit, having a value $R_b$).

In step S830, when the round parameter i is an odd number, the control unit 750 adds 1-bit data (data 1) to the MSB of the first converted data to form a first candidate address (12-bit, having a value $H_a$), and adds 1-bit data (data 0) to the MSB of the second converted data to form a second candidate address (12-bit, having a value $H_b$). When the round parameter i is an even number, the control unit 750 adds 1-bit data (data 0) to the MSB of the first converted data to form a first candidate address (12-bit, having a value $H_a$), and adds 1-bit data (data 1) to the MSB of the second candidate address to form a second candidate address (12-bit, having a value $H_b$).

In step S840, the control unit 750 determines whether the first candidate address is appropriate, i.e., determining whether $H_a$ is smaller than the threshold $N_{data}$, and accordingly generates a control signal to indicate whether the first candidate address is appropriate. Step S850 is performed if the first candidate address is appropriate ($H_a<N_{data}$), or else step S860 is performed.

In step S850, the control unit 750 outputs the first candidate address as the target address.

In step S852, the control unit 750 controls the shift register 710 to shift towards a lower bit (R'0) by one register unit. That is, the control unit 750 controls the multiplexer 712 to select and output the value corresponding to logic 1 using the control signal.

In step S854, the logic circuit 720 calculates values of $R'_i(N_r)$ and $R'_i(N_r-1)$. In this embodiment, for example, the logic unit 722 performs an XOR operation on the values of R'0 and R'2 and stores the result to R'11, and the logic unit 724 performs an XOR operation on the values of R'1 and R'3 and stores the result to R'12.

In step S856, the control unit 750 adds the round parameter i by 1.

In step S860, the control unit 750 outputs the second candidate address as the target address.

In step S862, the control unit 750 controls the shift register 710 to shift towards a lower bit (R'0) by two register units. That is, the control unit 750 controls the multiplexer 720 to select and output the value corresponding to logic 0 using a control signal.

In step S864, the logic circuit 720 calculates values of $R'_{i+1}(N_r)$ and $R'_{i+1}(N_r-1)$. In this embodiment, for example, the logic unit 722 performs an XOR operation on the values of R'0 and R'2 and stores the result to R'11, and the logic unit 724 performs an XOR operation on the values of R'1 and R'3 and stores the result to R'12.

In step S866, the control unit 750 adds the round parameter i by 2.

In step S870, the control unit 750 adds the parameter p by 1.

In step S880, step S820 is performed if the round parameter i is smaller than the maximum value $M_{max}$ ($=2^{Nr}$) and the parameter p is smaller than the threshold $N_{data}$, or else the process ends.

In this embodiment, two permutation circuits are used to generate two candidate addresses in each round, and one between the two candidate addresses is selected as the target address. As one of the two candidate addresses is essentially appropriate, an issue of having to re-calculate the address and hence wasting additional time in the event that only one address is generated in each round and the address is inappropriate can be eliminated. Therefore, the embodiment is capable of enhancing the overall performance of the de-interleaving process.

Figure 9:
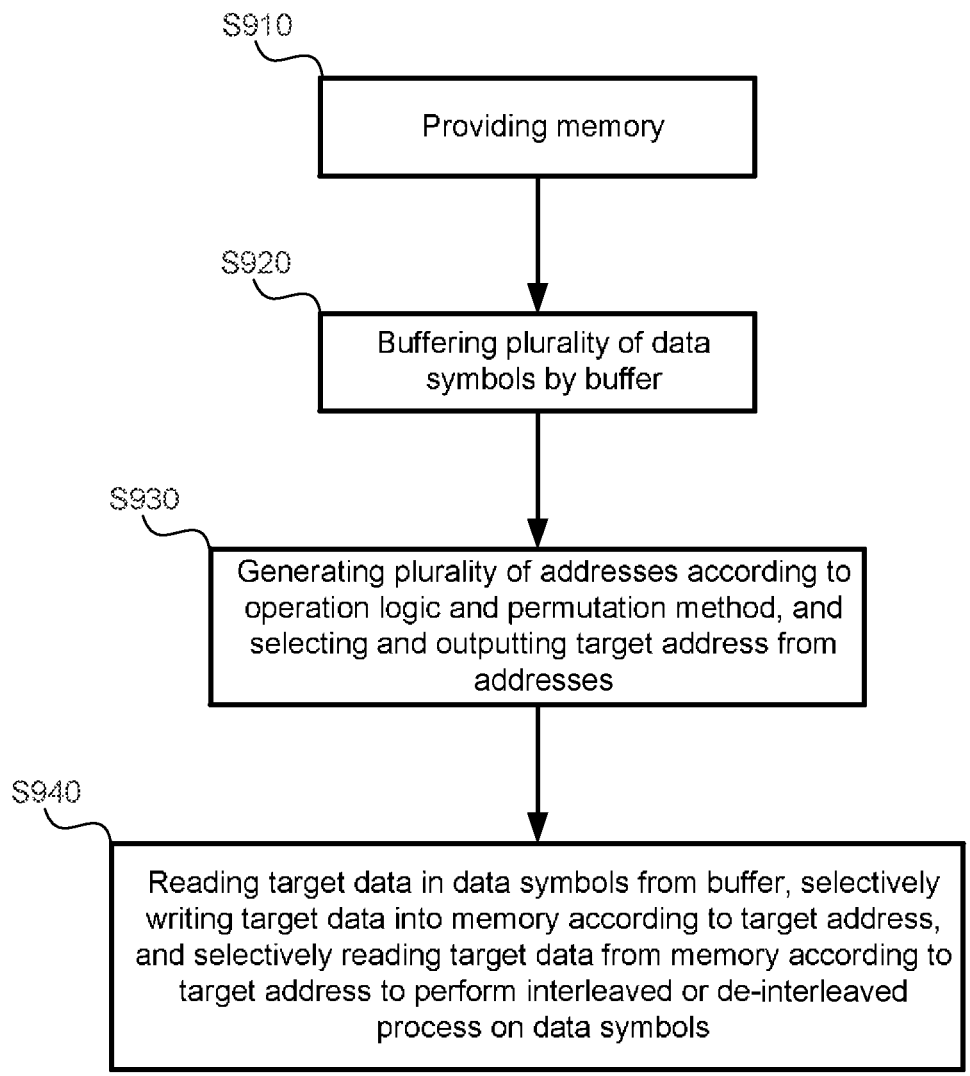
FIG. 9 is a flowchart of a data processing method according to an embodiment of the present invention.

In addition to the foregoing data processing device, the present invention correspondingly discloses a data processing method applied to a de-interleaving process in a DVB-T2 system. FIG. 9 shows a flowchart of a data processing method according to an embodiment of the present invention. The method is performed by the foregoing data processing circuit 100 or an equivalent device. As shown in FIG. 9, the data processing method according to an embodiment includes following steps.

In step S910, a memory is provided.

In step S920, a plurality of data symbols are buffered by a buffer. The data symbols are data to be de-interleaved.

In step S930, a plurality of addresses are generated according to an operation logic and a permutation method, and a target address is selected from the addresses and outputted. The operation logic is as shown in Table-1, with the modes having different operation logics. The permutation method is as shown in Table-2, Table-3 or Table-6 (taking 4K mode for example). In this step, in each round, two or more candidate addresses are generated, and one appropriate candidate is selected from these candidate addresses and outputted. In a preferred embodiment, two candidate addresses are generated in an odd-number or even-number round and stored, with one of the candidate addresses being outputted as the target address in a current round and the other candidate address being outputted as the target address in the next round (if the other candidate address is appropriate). In another preferred embodiment, two candidate addresses are generated in regardless of an odd-number round and an even-number round, and one of the candidate addresses is selected as the target address and outputted.

In step S940, target data in the data symbols is read from the buffer, selectively written into the memory according to the target address, and selectively read from the memory according to the target address to perform a de-interleaving operation for the data symbols. As previously described, when performing a de-interleaving operation, for different modes and different OFDM symbols (odd symbols or even symbols), the sequences for writing data into or reading data out of the memory are different. Thus, in this step, the data is sometimes sequentially written/read to/from the memory, or is sometimes written/read to/from the memory according to the target address generated in the previous step to complete the de-interleaving process.

One person skilled in the art can understand implementation details and variations of the methods in FIG. 4, FIG. 5a and FIG. 5b, FIG. 8a and FIG. 8b, and FIG. 9 from the disclosure of the devices in FIG. 1, FIG. 3, FIG. 6 and FIG. 7. Without affecting full disclosure and implementation of the method of the present invention, repetitive details are omitted herein. It should be noted that, the shapes, sizes, ratios and sequences of the steps in the drawings are examples for explaining the present invention to one person skilled in the art, not limiting the present invention. In possible implementation, one skilled person in the art would selectively implement part or all technical features of any embodiment of the application or selectively combine part or all technical features of the embodiments of the application based on the disclosure of the present invention to enhance the implementation flexibility of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data processing circuit, for performing a de-interleaving process in a Digital Video Broadcasting-Second Generation Terrestrial (DVB-T2) system, comprising:
    a buffer, buffering a plurality of data symbols;
    a memory, coupled to the buffer;
    an address generator, generating a plurality of addresses according to an operation logic and a permutation rule, and
        determining a target address from the addresses; and
    a memory controller, coupled to the memory, the buffer and the address generator,
    the memory controller moving the data symbols according to the target address until the data symbols are de-interleaved when the data symbols are read from the memory,
    wherein the address generator comprises:
    a shift register, comprising a plurality of registers that store binary data;
    a controller, coupled to the shift register, controlling the shift register to shift the binary data by two registers in each shift;
    a logic circuit, comprising two logic elements, each being coupled to three registers;
    a first permutation circuit, coupled to the shift register and the controller, converting a first set of the binary data according to the permutation rule to generate a set of first converted data; and
    a second permutation circuit, coupled to the shift register and the controller, converting a second set of the binary data according to the permutation rule to generate a set of second converted data;
    wherein, the controller generates the addresses according to the set of first converted data and the set of second converted data, and
    determines one of the addresses as the target address.

2. The data processing circuit according to claim 1, further comprising the shift register generating feedback data according to the operation logic, and outputting the feedback data to one of the three registers.

3. The data processing circuit according to claim 2, wherein the addresses comprise a first candidate address and a second candidate address;
    the controller controls shifting of the shift register according to a round parameter;
    when both of the first candidate address and the second candidate address are smaller than a threshold,
    the controller outputs the first candidate address as the target address in a current round, and halts shifting of the linear shift register and outputs the second candidate address in a next round.

4. The data processing circuit according to claim 2, wherein the controller controls shifting of the shift register according to a round parameter;
    when only one of the addresses is appropriate,
    the controller outputs the appropriate address as the target address in a current round, and then controls the shift register to shift in a next round so that the first permutation circuit and the second permutation circuit respectively update the first converted data and the second converted data.

5. The data processing circuit according to claim 4, wherein the addresses comprise a first candidate address and a second candidate address;
    when the round parameter is an even number,
    the controller controls the shift register to shift,
    outputs the smaller of the first candidate address and the second candidate address in the even-number round, and
    determines the next round parameter according to whether a larger of the first candidate address and the second candidate address is smaller than a threshold.

6. The data processing circuit according to claim 4, wherein the addresses comprise a first candidate address and a second candidate address;
    when the round parameter is an odd number,
    the controller controls the shift register to shift,
    determines to output the larger of the first candidate address and the second candidate address if the larger one is smaller than a the threshold, and
    determines the next round parameter.

7. The data processing circuit according to claim 2, wherein the logic elements of the logic circuit are:
    a first logic element, coupled to the shift register, obtaining values of two of the registers to perform an operation on the values according to the operation logic;

a second logic element, coupled to the shift register, obtaining values of two of the registers to perform an operation on the values according to the operation logic;
wherein, the two registers corresponding to the first logic element are respectively adjacent to the two registers corresponding to the second logic element.

8. The data processing circuit according to claim 2, wherein the shift register comprises a 1st to an Mth registers along to a shift direction, where M is a positive integer;
the first permutation circuit and the second permutation circuit are coupled to (M−2) registers, respectively, to convert M bits of the binary data;
the first permutation circuit is coupled to the 3rd to the Mth registers, and
the second permutation circuit is coupled to the 2nd to the (M−1)th registers.

9. The data processing circuit according to claim 2, wherein the shift register, along a shift direction, comprises a 1st to an Nth registers, where N is a positive integer;
the first permutation circuit is coupled to the N registers to convert the binary data;
the second permutation circuit is coupled to the 1st to the (N−1)th registers and is coupled to the logic circuit to convert data of a total of N-bit data,
including (N−1) bits of the binary data and 1 bit from the logic circuit.

10. A data processing circuit, for performing a de-interleaving process in a Digital Video Broadcasting-Second Generation Terrestrial (DVB-T2) system, comprising:
a buffer, buffering a plurality of data symbols;
a memory, coupled to the buffer;
an address generator, generating a plurality of addresses according to an operation logic and a permutation rule, and
determining a target address from the addresses; and
a memory controller, coupled to the memory, the buffer and the address generator,
the memory controller moving the data symbols according to the target address until the data symbols are de-interleaved when the data symbols are read from the memory,
wherein the address generator comprises:
a shift register, comprising a plurality of register units that store binary data;
a controller, coupled to the shift register, controlling the shift register to shift the binary data by one or two register units in each shift;
a logic circuit, coupled to the shift register, generating feedback data according to the operation logic and data of a part of the register units of the shift register, and outputting the feedback data to the shift register;
a first permutation circuit, coupled to the shift register and the controller, converting a part of the binary data according to the permutation rule to generate a set of first converted data;
a second permutation circuit, coupled to the shift register and the controller, converting a part of the binary data according to the permutation rule to generate a set of second converted data;
wherein, the control unit generates the addresses according to the set of first converted data and the set of second converted data, and
determines whether the addresses are smaller than a threshold to generate a control signal; and
a plurality of selecting units, respectively corresponding with a part of the register units, selecting, according to the control signal, a value of one register unit or two register units before the corresponding register unit as a new value of the corresponding register unit after shifting.

11. The data processing circuit according to claim 10, wherein the addresses comprise a first candidate address and a second candidate address;
if the control signal indicates that the first candidate address is smaller than the threshold,
the controller controls the shift register to shift by one register unit, or else the controller controls the shift register to shift by two register units.

12. The data processing circuit according to claim 10, wherein the logic circuit comprises:
a first logic unit, coupled to the shift register, obtaining values of K number of register units to perform an operation on the values according to the operation logic;
a second logic unit, coupled to the shift register, obtaining values of K number of register units to perform an operation on the values according to the operation logic;
wherein, the K number of register units corresponding to the first logic unit are respectively adjacent to K number of register units corresponding to the second logic units,
where K is a positive integer.

13. The data processing circuit according to claim 10, wherein the addresses comprise a first candidate address and a second candidate address;
when the round parameter is an even number,
the controller causes a most significant bit (MSB) of the first candidate address to be 1 and causes an MSB of the second candidate address to be 0;
when the round parameter is an odd number,
the controller causes the MSB of the first candidate address to be 0 and causes the MSB of the second candidate address to be 1.

14. The data processing circuit according to claim 13, wherein the shift register comprises a 1st to an Mth register units along to a shift direction,
where M is a positive integer;
the first permutation circuit is coupled to the 2nd to the Mth register units, and the second permutation circuit is coupled to the 1st to the (M−2)th register units.

15. The data processing circuit according to claim 14, wherein when the round parameter is smaller than or equal to a predetermined value,
the first permutation circuit generates the first converted data according to values of the 3rd to the Mth register units;
when the round parameter is greater than the predetermined value,
the first permutation circuit generates the first converted data according to values of the 2nd to the (M−1)th register units.

16. A data processing method, for performing a de-interleaving process in a Digital Video Broadcasting-Second Generation Terrestrial (DVB-T2) system, comprising:
a) providing a memory;
b) buffering a plurality of data symbols by a buffer;
c) generating a plurality of addresses according to an operation logic and a permutation rule, and determining a target address from the addresses; and
d) moving the data symbols according to the target address, wherein step (c) comprises:
c1) providing a shift register to store binary data, the shift register comprising a plurality of register units;

c2) generating feedback data according to the operation logic and data of a part of the register units of the shift register, and
sending the feedback data to the shift register;
c3) converting a part of the binary data according to the permutation rule to generate first converted data;
c4) converting a part of the binary data according to the permutation rule to generate second converted data; and
c5) controlling shifting of the shift register,
generating the addresses according to the first converted data and the second converted data, and
determining one of the addresses as the target address; wherein, the shift register shifts data by two register units in each shift.

17. The data processing method according to claim 16, wherein the addresses comprise a first candidate address and a second candidate address;
step (c5) comprises: controlling shifting of the shift register according to a round parameter;
when both of the first candidate address and the second candidate address are smaller than a threshold,
outputting the first candidate address in a current round, controlling the shift register to halt shifting, and
outputting the second candidate address in a next round.

18. The data processing method according to claim 16, wherein step (c5) comprises:
controlling shifting of the shift register according to a round parameter;
when only one of the addresses is smaller than the threshold,
outputting the address that is smaller than the threshold in a current round, and
controlling the shift register to shift in a next round to cause updating of the first converted data and the second converted data in step (c3) and step(c4) respectively.

19. The data processing method according to claim 18, wherein the addresses comprise a first candidate address and a second candidate address;
step (c5) further comprises:
when the round parameter is an even number,
controlling the shift register to shift, outputting the smaller of the first candidate address and the second candidate address in the even-number round, and
determining the next round parameter according to whether the larger of the first candidate address and the second candidate address is smaller than a threshold.

* * * * *